United States Patent
Lin et al.

(10) Patent No.: US 6,671,209 B2
(45) Date of Patent: Dec. 30, 2003

(54) ERASING METHOD FOR P-CHANNEL NROM

(75) Inventors: Hung-Sui Lin, Hsin-Ying (TW); Han-Chao Lai, Taichung (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/035,514

(22) Filed: Oct. 22, 2001

(65) Prior Publication Data

US 2003/0067807 A1 Apr. 10, 2003

(30) Foreign Application Priority Data

Sep. 28, 2001 (TW) .................................. 90124032 A

(51) Int. Cl.$^7$ ............................................... G11C 16/04
(52) U.S. Cl. ........................... 365/185.29; 365/185.18; 365/185.26; 365/185.27
(58) Field of Search ...................... 365/185.29, 185.26, 365/185.33, 185.18, 185.27

(56) References Cited

U.S. PATENT DOCUMENTS

| | | | |
|---|---|---|---|
| 6,172,397 B1 | * | 1/2001 | Oonakado et al. ............. 257/21 |
| 6,331,952 B1 | * | 12/2001 | Wang et al. ............ 365/185.29 |
| 6,441,443 B1 | * | 8/2002 | Hsu et al. .................... 257/371 |

* cited by examiner

Primary Examiner—Hoai Ho
(74) Attorney, Agent, or Firm—J.C. Patents

(57) ABSTRACT

An erasing method for a p-channel nitride read only memory. The method is used for a p-channel nitride read only memory having charges stored in a charge-trapping layer. A positive voltage is applied to the control gate and a negative voltage to the drain; also, the source is floating and the n-well is grounded. The voltage difference between the positive voltage applied to the control gate and the negative voltage to the drain is sufficient to trigger a band-to-band induced hot electron injection to erase the p-channel nitride read only memory.

6 Claims, 1 Drawing Sheet

ERASING METHOD FOR P-CHANNEL NROM

CROSS-REFERENCE TO RELATED APPLICATION

This application claims the priority benefit of Taiwan application serial no. 90124032, filed Sep. 28, 2001.

BACKGROUND OF THE INVENTION

1. Field of the Invention

This invention relates in general to an erasing method for a p-channel Silicon Nitride Read Only Memory, (p-channel NROM), and more specifically relates to an erasing method for a p-channel NROM by means of band-to-band induced hot electron injection.

2. Description of Related Art

Electrically erasable programmable read only memories (EEPROMs) are programmable and erasable, and the data stored in the EEPROMs can be kept even though the EEPROMs are powered off. Therefore, the EEPROMs are widely used in personal computers and electrical devices.

Among the electrically erasable programmable read only memories (EEPROMs), the EEPROM with an oxide-nitride-oxide (ONO) structure is massively studied because a nitride layer of the ONO structure can be used to trap and store electrons. For programming or erasing EEPROM with the ONO structure, the nitride layer in the ONO structure serves as a charge-trapping layer for replacing a conventional floating gate of a flash memory cell. At present, several EEPROMs with the ONO structure are developed, for example a silicon-oxide-nitride-oxide-silicon (SONOS) ROM and a nitride ROM (NROM). The SONOS ROM advantages low operational voltages and therefore the cell size can be reduced for further increasing the integration. Electrons injected into the nitride layer of the NROM cell are localized and therefore sensitivity for defects of the tunneling oxide layer is smaller, resulting in low leakage current. Furthermore, two bits can be programmed into a single cell (1 cell 2 bit), meaning that four storage states can be made within a single NROM cell. Therefore, the EEPROM with the ONO structure provides a better device efficiency.

On the other hand, the p-channel memory device is superior to the n-channel memory device because of high electron injection efficiency, high scalability, reliability preventing holes form injection, and a lower electric field for the tunneling oxide during electron injection. Therefore, a p-channel EEPROM with the ONO structure has advantages and perspective for development in the future.

However, for a p-channel SONOS ROM, the Fowler-Nordheim (F-N) tunneling effect is used for programming the memory cell. All electrons in the channel tunnel through the barrier of a tunneling oxide layer (the oxide layer of the ONO structure) into the nitride layer, and distribute uniformly in the nitride layer. As a result, one SONOS ROM cell can only store one bit.

In addition, it also utilizes the Fowler-Nordheim (F-N) tunneling effect to erase the memory cell. Then, all electrons stored in the nitride layer tunnel through the barrier of the tunneling oxide layer into the substrate. However, the SONOS memory device can only be erased by block, rather than by cell, causing many restrictions on the operation of program, erase and read for the SONOS memory device.

Conventionally, channel hot electron injection is used for erasing the p-channel NROM. Electrons are injected from the nitride layer to the drain through the tunneling oxide. One of the drawbacks is that the channel has to be opened when the p-channel NROM is erased by the channel hot electron injection, causing that the leakage current is easily occurred. Another drawback is that the two-bit data stored in the p-channel NROM are erased simultaneously, and therefore erasing operation is restricted because of the foregoing reasons.

SUMMARY OF THE INVENTION

According to the foregoing drawbacks of the erasing operation for the p-channel SONOS ROM or p-channel NROM, an object of the invention is to provide an erasing method for a p-channel NROM without opening its channel, thereby the drain leakage current is not occurred and the power consumption is reduced.

It is another object to provide an erasing method for a p-channel NROM capable of erasing by single bit or two bits for a single cell, or capable of erasing by byte, sector or block for a memory array.

The invention provides an erasing method for a p-channel nitride read only memory. The method is used for a p-channel nitride read only memory having charges stored in a charge-trapping layer. A positive voltage is applied to the control gate and a negative voltage to the drain; also, the source is floating and the n-well is grounded. The voltage difference between the positive voltage applied to the control gate and the negative voltage to the drain is sufficient to trigger a band-to-band induced hot electron injection to erase the p-channel nitride read only memory.

BRIEF DESCRIPTION OF THE DRAWINGS

While the specification concludes with claims particularly pointing out and distinctly claiming the subject matter which is regarded as the invention, the objects and features of the invention and further objects, features and advantages thereof will be better understood from the following description taken in connection with the accompanying drawings in which:

DESCRIPTION OF THE PREFERRED EMBODIMENT

Figure 1:
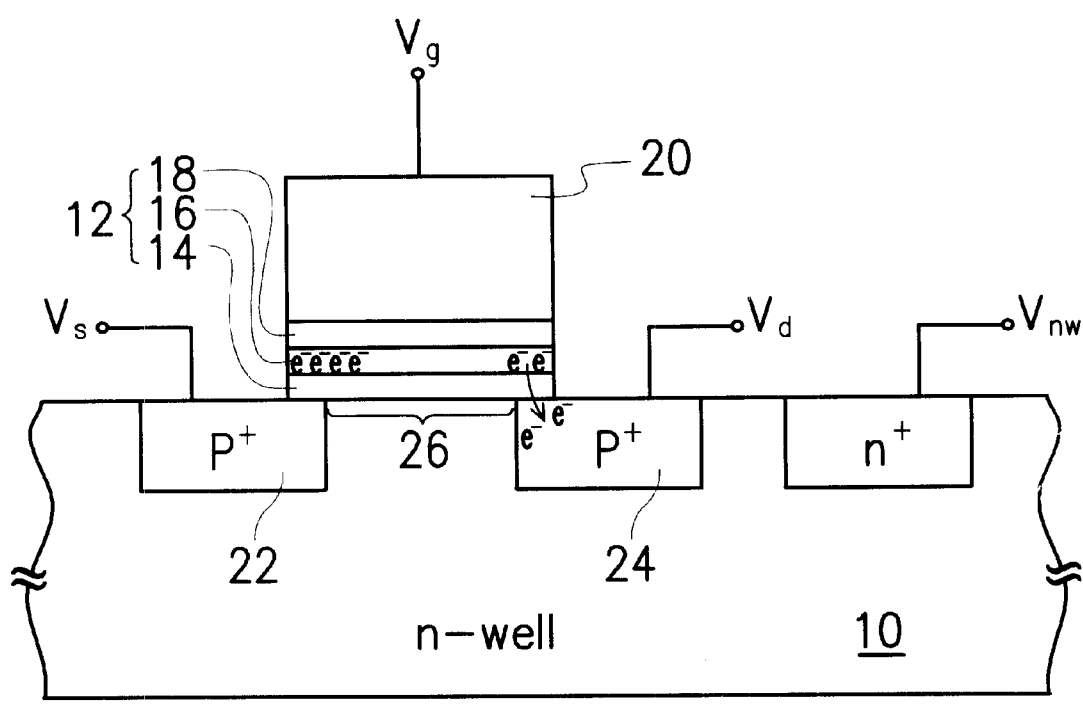
FIG. 1 is a cross-sectional view of a p-channel NROM for illustrating an erasing process according to the invention.

FIG. 1 is a cross-sectional view of a p-channel NROM for illustrating an erasing process according to the invention.

Referring to FIG. 1, the p-channel NROM is formed on an n-type substrate 10. A oxide-nitride-oxide (ONO) layer 12, consisting of a tunneling oxide layer 14, a silicon nitride layer 16 serving as a trapping layer and a dielectric layer 18, is formed on the substrate 10. A conductive layer 20 as a gate electrode is formed on the ONO layer 12 and is made of polysilicon for example. A source region 22 and a drain region 24 are formed at both sides of the ONO layer 12 in an N-well within the substrate 10. And, in the substrate 10 a channel 26 is formed between the source region 22 and the drain region 24 and under the ONO layer 12. The source region 22, the drain region 24 and the conductive layer 20 are implanted with p-type ions. The conductive layer 20 serves as a control gate of the p-channel NROM.

Referring to FIG. 1, when the p-channel NROM cell is erased according to the invention, a positive voltage Vg is applied to the control gate, a negative voltage Vd is applied to the drain, the source is floating, and the N-well is grounded. The voltage bias condition is summarizes in Table I below.

TABLE I

|  | node voltage | bias condition |
|---|---|---|
| p-channel NROM | Vg | positive voltage |
|  | Vd | negative voltage |
|  | Vs | floating |
|  | Vnw | ground |

The voltage difference between the positive voltage Vg applied to the control gate and the negative voltage applied to the drain is large enough to trigger the band-to-band induced hot electron injection between the gate and the drain of the p-channel NROM.

When the p-channel NROM is erased by the band-to-band induced hot electron injection, a deep depletion occurs at an overlapped region between the gate 20 and the drain 24. Due to the large electric field perpendicular to the tunneling oxide 14, charges in the charge-trapping layer 16 near the drain 24 pass through the tunneling 14 into the drain 24. According to the erasing mechanism, the channel 26 is not opened by the voltage difference between the gate voltage Vg and the drain voltage Vd.

Furthermore, in the embodiment, a single cell of the p-channel NROM is erased by one bit near the drain side. However, by properly controlling the voltages applied to the word lines and bit lines, a single p-channel NROM cell can be erased by one bit or two bits, or even a memory array formed by the p-channel NROM cells can be erased by byte, sector or block using the erasing operation of the invention.

As described above, band-to-band induced hot electron injection is utilized to erase the p-channel NROM with a proper bias condition. The channel of the p-channel NROM is not opened during the erasing operation and therefore the drain leakage current is not occurred. Thus, the operational voltages and the power consumption are reduced.

According to the erasing operation of the invention, a single p-channel NROM cell can be erased by one bit or two bits, or even a memory array formed by the p-channel NROM cells can be erased by byte, sector or block by properly controlling the voltages applied to the word lines and bit lines. Therefore, it increases degree of freedom to program, read and erase the p-channel NROM memory device.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What claimed is:

1. An erasing method for a p-channel nitride read only memory, wherein the p-channel nitride read only memory has a control gate, a drain and a source formed in a n-well, and a channel between the source and the drain, the erasing method comprising:

applying a first voltage to the control gate and a second voltage to the drain; and applying a third and a fourth voltages to the source and the n-well respectively, wherein a voltage difference between the first voltage and the second voltage is sufficient to trigger a band-to-band induced hot electron injection without opening the channel to erase the p-channel nitride read only memo.

2. The erasing method of claim 1, wherein the first voltage is a positive voltage.

3. The erasing method of claim 1, wherein the second voltage is a negative voltage.

4. The erasing method of claim 1, wherein the third voltage is to float the source.

5. The erasing method of claim 1, wherein the fourth voltage is a ground voltage.

6. The erasing method of claim 1, wherein the voltage difference is not opened a channel of the p-channel nitride read only memory.

* * * * *